(12) United States Patent
Duong et al.

(10) Patent No.: US 12,476,175 B2
(45) Date of Patent: Nov. 18, 2025

(54) GLASS SUBSTRATES HAVING TRANSVERSE CAPACITORS FOR USE WITH SEMICONDUCTOR PACKAGES AND RELATED METHODS

(71) Applicant: Intel Corporation, Santa Clara, CA (US)

(72) Inventors: Benjamin T. Duong, Phoenix, AZ (US); Srinivas V. Pietambaram, Chandler, AZ (US); Aleksandar Aleksov, Chandler, AZ (US); Helme Castro De La Torre, Gilbert, AZ (US); Kristof Darmawikarta, Chandler, AZ (US); Darko Grujicic, Chandler, AZ (US); Sashi S. Kandanur, Chandler, AZ (US); Suddhasattwa Nad, Chandler, AZ (US); Rengarajan Shanmugam, Chandler, AZ (US); Thomas I. Sounart, Chandler, AZ (US); Marcel A. Wall, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 906 days.

(21) Appl. No.: 17/485,039

(22) Filed: Sep. 24, 2021

(65) Prior Publication Data

US 2023/0095846 A1 Mar. 30, 2023

(51) Int. Cl.
*H05K 1/11* (2006.01)
*H01G 4/33* (2006.01)
(Continued)

(52) U.S. Cl.
CPC ......... *H01L 23/49822* (2013.01); *H01G 4/33* (2013.01); *H01L 21/486* (2013.01); *H05K 1/111* (2013.01); *H05K 1/115* (2013.01); *H05K 1/16* (2013.01); *H05K 1/18* (2013.01); *H05K 1/182* (2013.01); *H01G 4/306* (2013.01); *H05K 1/0231* (2013.01)

(58) Field of Classification Search
CPC ............. H01L 23/49822; H01L 21/486; H01L 23/49816; H01L 23/49827; H01L 23/15; H01G 4/33; H01G 4/306; H01G 4/40
See application file for complete search history.

(56) References Cited

U.S. PATENT DOCUMENTS 9,391,015 B2 * 7/2016 Jeannot ............... H01L 23/5223
2014/0144681 A1 * 5/2014 Pushparaj ......... H01L 23/49894
428/164

(Continued)

*Primary Examiner* — Ishwarbhai B Patel
(74) *Attorney, Agent, or Firm* — Hanley, Flight & Zimmerman, LLC (57) ABSTRACT

Glass substrates having transverse capacitors for use with semiconductor packages and related methods are disclosed. An example semiconductor package includes a glass substrate having a through glass via between a first surface and a second surface opposite the first surface. A transverse capacitor is located in the through glass via. The transverse capacitor includes a dielectric material positioned in a first portion of the through glass via, a first barrier/seed layer positioned in a second portion of the through glass via, and a first conductive material positioned in a third portion of the through glass via.

17 Claims, 9 Drawing Sheets

(51) Int. Cl.
*H01L 21/48* (2006.01)
*H01L 23/498* (2006.01)
*H05K 1/16* (2006.01)
*H05K 1/18* (2006.01)
H01G 4/30 (2006.01)
H05K 1/02 (2006.01)

(56) References Cited

U.S. PATENT DOCUMENTS

2015/0043126 A1\* 2/2015 Hurwitz .................. H01G 4/33
 361/303
2020/0395435 A1\* 12/2020 Haratipour ............ H01L 23/552

\* cited by examiner

GLASS SUBSTRATES HAVING TRANSVERSE CAPACITORS FOR USE WITH SEMICONDUCTOR PACKAGES AND RELATED METHODS

FIELD OF THE DISCLOSURE

This disclosure relates generally to integrated circuit packaging and, more particularly, to glass substrates having transverse capacitors for use with semiconductor packages and related methods.

BACKGROUND

Integrated circuits (IC) chips and/or semiconductor dies are routinely connected to larger circuit boards such as motherboards and other types of printed circuit boards (PCBs) via a package substrate. As integrated circuit (IC) chips and/or dies reduce in size and interconnect densities increase, alternatives to traditional substrate layers are needed for providing stable transmission of high frequency data signals between different circuitry and/or increased power delivery.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc.

DETAILED DESCRIPTION

Advances in semiconductor packaging architectures result in increased demands on the material properties of the package substrate. For example, as package substrates become thinner to achieve a lower profile, a core of the substrate having a small thickness can be susceptible to warping or bending over time, thereby reducing the functionality of the package substrate. For example, for smaller sized package assemblies (e.g., thin or low profile packages for mobile or other devices), a core of the substrate assembly needs to have improved total thickness variation (TTV), lower coefficient of thermal expansion (CTE), lower shrinkage, and higher elastic modulus. To improve such characteristics of a package substrate, glass layers can be employed. In some examples, package substrates can include a layer or substrate made of glass to restrict or prevent the package assembly from warping or bending from its initial manufactured shape over time. The glass substrate can include, for example, a core layer, an interposer and/or any other layer of a semiconductor package.

Additionally, to transmit multiple and/or high frequency signals between package components, semiconductor packages often employ planar transmission lines such as microstrip, stripline, and coplanar transmission lines to transmit signals and/or power. Furthermore, in high density, high speed interconnect substrates, increased power delivery and signaling requirements require dense signaling process areas (e.g., a greater amount of surface area or space) of a build-up layer or a bump layer of a semiconductor package. As electronic systems become more complex and electrical interfaces in the electrical systems operate at higher frequencies, dense signal processing areas can cause significant crosstalk or unwanted signal cross-over between adjacent signal paths in such densely packed spaces. For example, crosstalk may be noise induced by one signal that interferes with another signal, which reduces the performance of the semiconductor substrate.

Examples disclosed herein employ transverse capacitors provided in through glass vias (TGVs) of a glass substrate. In some examples, transverse capacitors disclosed herein are provided to alleviate or increase (e.g., free up) signal routing patterning in adjacent layers (e.g., build-up layers and/or die signal or power lines). In some examples, transverse capacitors disclosed herein supplement capacitance values of thin film capacitors. For instance, transverse capacitors disclosed herein can be structured to electrically couple to thin film capacitors in parallel to provide an increased, overall capacitance (e.g., for high power input/output applications). Thus, the thin film capacitor and the transverse capacitor can provide an overall capacitance rating (e.g., capacitance measure of unit).

Additionally, example glass substrates disclosed herein enable fabrication of example transverse capacitors disclosed herein with manufacturing processes such as, for example, chemical vapor deposition, atomic layer deposition, etc., that typically cannot be used with traditional substrate materials because such processes operate at higher or elevated temperatures. Thus, fabrication processes for traditional substrates typically employ physical vapor deposition processes during fabrication of capacitors because physical vapor deposition processes operate at lower temperatures compared to chemical vapor deposition and atomic layer deposition processes.

An example transverse capacitor disclosed herein is provided inside a through glass via (TGV) of the glass substrate. In some examples, the transverse capacitor includes a first conductive material, a first barrier/seed layer and a dielectric material. In some examples, the first barrier/seed layer is positioned between the first conductive material and the dielectric material, and the dielectric material is positioned between the first barrier/seed layer and a first surface of the glass substrate. In some examples, the first barrier/seed layer directly engages or directly couples to the first conductive material and the dielectric material, and the dielectric material directly engages the first barrier/seed layer. In some examples, the dielectric material is flush with the first surface of the glass substrate. In some examples, the dielectric material is recessed inside the TGV from the first surface of the glass substrate.

Example semiconductor packages disclosed herein can be used with semiconductor dies or chiplets (e.g., tiles) that can implement controllers, microprocessors, Digital Signal Processors (DSPs), Central Processor Units (CPUs), Graphics Processor Units (GPUs), programmed microprocessors, Field Programmable Gate Arrays (FPGAs), Application Specific Integrated Circuits (ASICs), Reduced Instruction Set Computers (RISCs), any other circuitry and/or combinations thereof. Additionally, example semiconductor packages disclosed herein can be used with chiplets of a disaggregated die. Each chiplet (also referred to as a tile) may implement a dedicated function. Together, the chiplets may implement a complex circuitry. The complex circuitry can be any type of device that can be implemented as a plurality of chiplets that are physically separated from, but communicatively coupled to, one another. For example, processor circuitry may be implemented by two or more separate chiplets that together implement a microprocessor, etc. Alternatively, in other examples, example semiconductor packages disclosed herein may be different chips (e.g., a processor circuitry, a memory, and/or or some other type of component) that together implement a system on a chip (SoC) in a semiconductor package.

Figure 1:
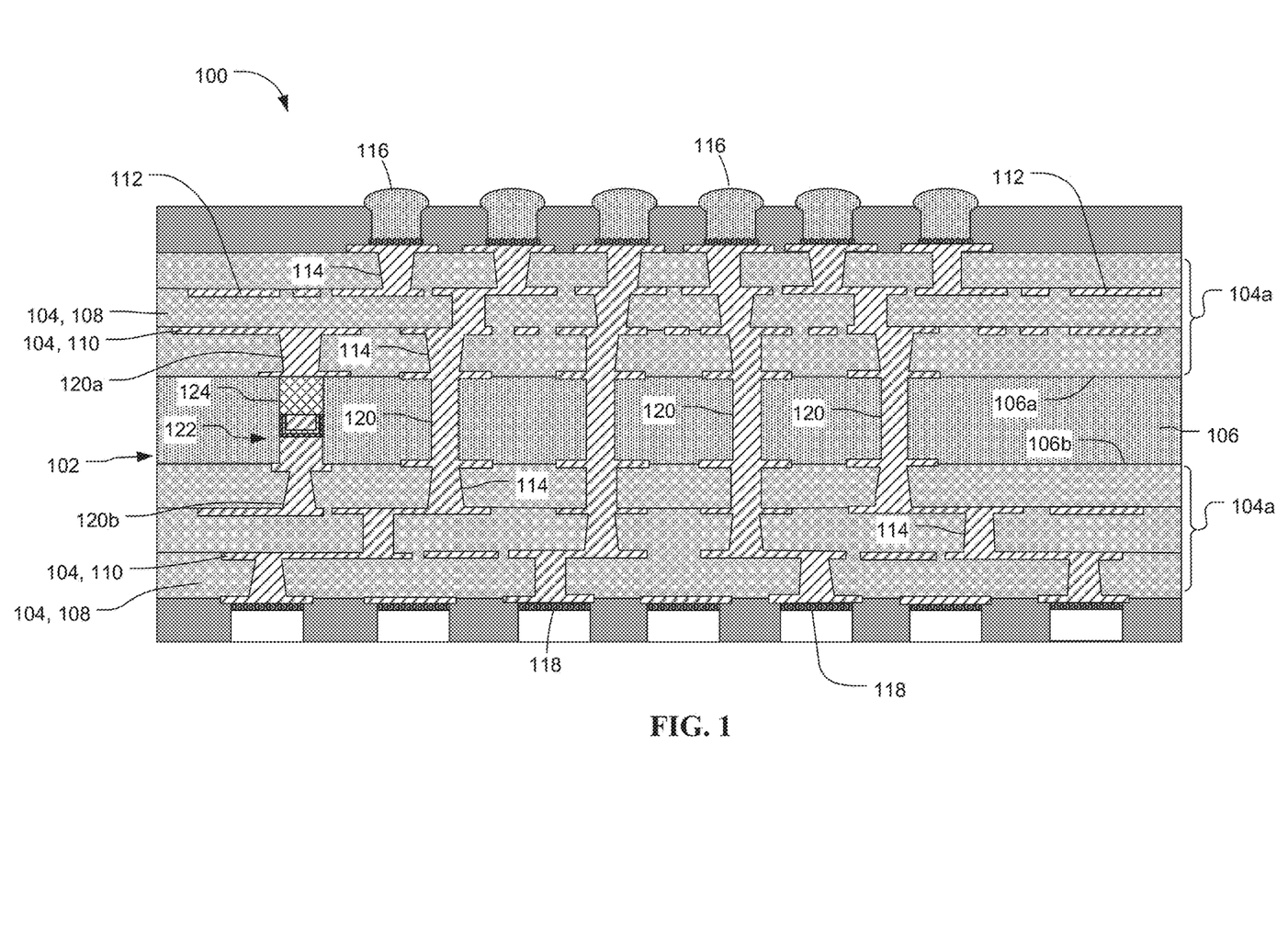
FIG. 1 is a cross-sectional view of an example semiconductor package including an example glass substrate constructed in accordance with teachings of this disclosure.

FIG. 1 is a cross-sectional view of an example semiconductor package 100 including an example glass substrate 102 (e.g., a glass core layer) in accordance with teachings of this disclosure. The semiconductor package 100 of the illustrated example includes a plurality of build-up layers 104 and a core layer 106. Specifically, the build-up layers 104 are provided on a first surface 106a of the core layer 106 and a second surface 106b of the core layer 106 opposite the first surface 106a. The build-up layers 104 of the illustrated example are provided in an alternating pattern of insulation or dielectric layers 108 and conductive layers 110 (e.g., patterned electrically) forming a plurality of traces 112 between the dielectric layers 108. The traces 112 of the illustrated example define signal traces (e.g., signaling lines) to transfer signals or information between various components (e.g., transistors, capacitors, resistors, backend layers, etc. and/or other circuitry) of the semiconductor package 100 and/or power traces for transferring or carrying power to the various components of the semiconductor package 100. Electrically conductive vias or through substrate vias (TSV) 114 (e.g., copper plated vias) extend through the dielectric layers 108 and electrically interconnect the conductive layers 110 of the different build-up layers 104. In the illustrated example, the semiconductor package 100 includes a plurality of solder connectors 116 (e.g., solder balls) and a plurality of solder pads 118 to electrically couple the semiconductor package 100 to a printed circuit board, an interposer and/or any other substrate(s).

The glass substrate 102 of the illustrated example defines or forms the core layer 106. Thus, the core layer 106 of the illustrated example is composed of glass. The core layer 106 of the illustrated example is positioned between a first plurality 104a of the build-up layers 104 (e.g., on the first surface 106a of the core layer 106) and a second plurality 104b of the build-up layers 104 (e.g., on the second surface 106b of the core layer 106). To communicatively and/or electrically couple one or more of the first plurality 104a of the build-up layers 104 and one or more of the second plurality 104b of build-up layers 104, the core layer 106 of the illustrated example employs a plurality of through glass vias (TGVs) 120 (e.g., copper plated vias). Additionally, the example glass substrate 102 of the illustrated example employs a transverse capacitor 122 positioned in a through glass via (TGV) 124 of the glass substrate 102. For example, the transverse capacitor 122 is electrically or communicatively coupled to a first TSV 120a of the first plurality 104a of the build-up layers 104 at the first surface 106a of the glass substrate 102 and a second TSV 120b of the second plurality 104b of the build-up layers 104 at the second surface 106b of the glass substrate 202. In some examples, the transverse capacitor 122 can be communicatively and/or electrically coupled (e.g., in parallel) to a thin film capacitor (TFC) formed in-plane with the build-up layers 104. In the illustrated example, the transverse capacitor 122 supplements the TFC such that an overall capacitance capability is provided by the transverse capacitor 122 and the TFC (e.g., a summation of a maximum capacitance rating or measurement of the transverse capacitor 122 and a maximum capacitance rating or measurement of the TFC). In other words, in operation, the transverse capacitor 122 supplements the TFC.

Although the glass substrate 102 of the illustrated example includes a single transverse capacitor, the glass substrate 102 can include a plurality of transverse capacitors. Additionally, although the glass substrate 102 of the illustrated example is the core layer 106 of the semiconductor package 100, in some examples, the glass substrate 102 can be an interposer and/or any other layer of the semiconductor package 100. For example, the glass substrate 102 can be used in place of one or more of the dielectric layers 108 of the semiconductor package 100.

Figure 2:
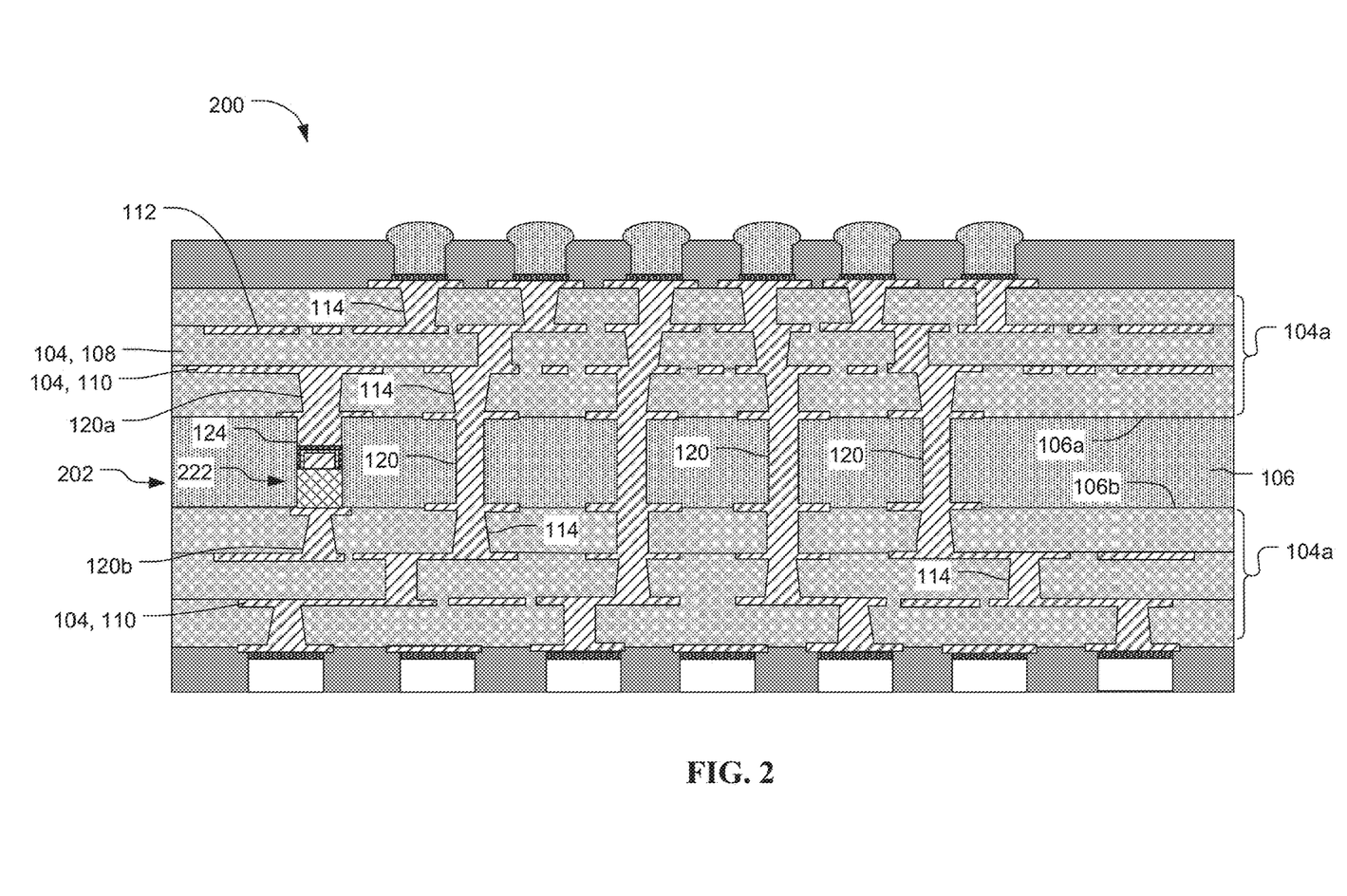
FIG. 2 is a cross-sectional view of another example semiconductor package including an example glass substrate constructed in accordance with teachings of this disclosure.

FIG. 2 is a cross-sectional view of another example semiconductor package 200 including the example glass substrate 102 of FIG. 1. Many of the components of the example semiconductor package 200 of FIG. 2 are substantially similar or identical to the components described above in connection with the semiconductor package 100 of FIG. 1. As such, those components will not be described in detail again below. Instead, the interested reader is referred to the above corresponding descriptions for a complete written description of the structure and operation of such components. To facilitate this process, similar or identical reference numbers will be used for like structures in FIG. 2 as used in FIG. 1. For example, the example semiconductor package 200 of FIG. 2 includes a glass substrate 202 and a transverse capacitor 222 formed in the TGV 124. The glass substrate 202 of the illustrated example defines or forms the core layer 106 positioned between a first plurality 104a of the build-up layers 104 (e.g., on the first surface 106a of the core layer 106) and a second plurality 104b of the build-up layers 104 (e.g., on the second surface 106b of the core layer 106). To communicatively and/or electrically couple one or more of the first plurality 104a of the build-up layers 104 and one or more of the second plurality 104b of build-up layers 104, the core layer 106 of the illustrated example employs a plurality of through glass vias (TGVs) 120 (e.g., copper plated vias). The transverse capacitor 222 is electrically or communicatively coupled to a first TSV 120a of the first plurality 104a of the build-up layers 104 at the first surface 106a of the glass substrate 102 and a second TSV 120b of the second plurality 104b of the build-up layers 104 at the second surface 106b of the glass substrate 202.

In contrast to the example semiconductor package 100, the transverse capacitor 122 of the semiconductor package 200 of FIG. 2 is provided in an orientation different than the orientation of FIG. 1. More specifically, the transverse capacitor 122 is provided in an upside down orientation compared to the orientation of FIG. 1. In this manner, a dielectric material of the transverse capacitor 122 of FIG. 1 is oriented toward a first surface 106a of the glass substrate 202 and/or the build-up layers 104a and a dielectric material of the transverse capacitor 222 of FIG. 2 is oriented toward the second surface 106b of the glass substrate 202 and/or the build-up layers 104b. In some examples, the transverse capacitor 222 can be communicatively and/or electrically coupled (e.g., in parallel) to a thin film capacitor (TFC) formed in-plane with the build-up layers 104.

Figure 3:
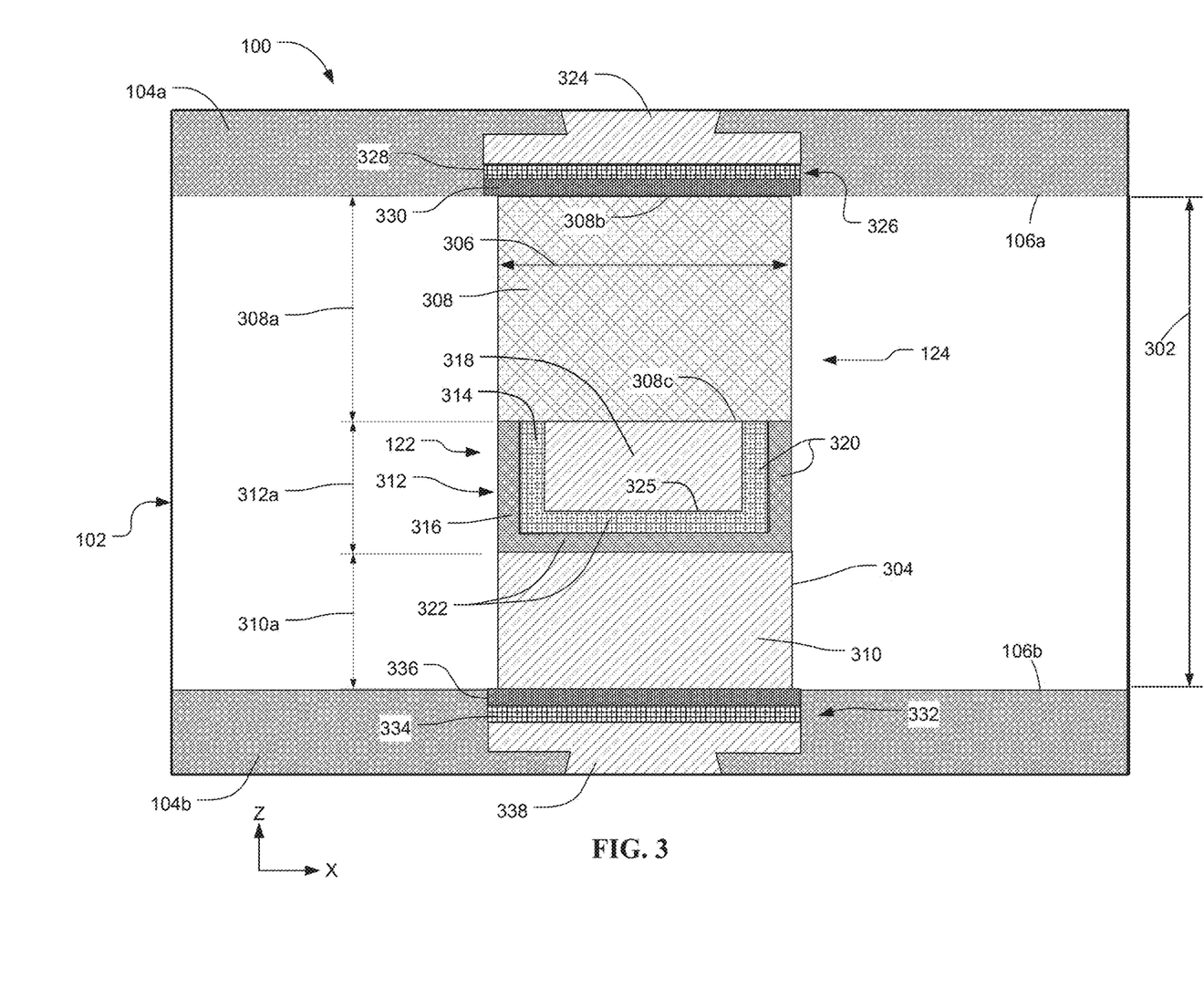
FIG. 3 is an enlarged, partial cross-sectional view of an example transverse capacitor of the example semiconductor package of FIG. 1.

FIG. 3 is an enlarged, partial cross-sectional view of the example transverse capacitor 122 of FIG. 1. The glass substrate 102 of the illustrated example has an overall thickness 302 between the first surface 106a and the second surface 106b. In the orientation of FIG. 3, the overall thickness 302 extends in a z-direction of a reference cartesian coordinate system (e.g., a vertical or stack-up/build-up direction in the orientation of FIG. 1). In some examples, the overall thickness 302 can be any desired thickness (e.g., between 50 micrometers (μm) and 1 millimeter micrometers (mm)). The glass substrate 102 of the illustrated example can be composed of glass material(s) including, but not limited to, borosilicate, quartz, fused silica, and/or any other suitable material(s).

To define the transverse capacitor 122 and/or the TGV 124, the glass substrate 102 of the illustrated example includes an opening or TGV 304. The TGV 304 extends between the first surface 106a of the glass substrate 102 and the second surface 106b of the glass substrate 102. The TGV 304 of the illustrated example extends substantially perpendicular to the surfaces 106a-b (e.g., vertically) between the first surface 106a and the second surface 106b. As used herein, "substantially vertically" means perfectly vertical or within 5 degrees of perfectly vertical. The TGV 304 of the illustrated example is a cylinder (e.g., has a cylindrical shape). For example, the TGV 304 defines a diameter 306. However, in other examples, the TGV 304 can have a conical shape, hour-glass shape, and/or any other suitable shape(s). The diameter 306 of the TGV 304 is proportional to a capacitance rating or capability (e.g., a measured unit) of the transverse capacitor 122. For example, the larger the diameter 306, the greater an amount of capacitance of the transverse capacitor 122. As used herein, capacitance of the transverse capacitor means an amount of energy that the transverse capacitor can store (e.g., measured in units of Farad).

To define the transverse capacitor 122, the TGV 124 of the illustrated example includes a dielectric material 308, a first conductive material 310 and a first barrier/seed layer 312. In the illustrated example, the dielectric material 308 has a first thickness 308a (e.g., in the z-direction or the stack up direction), the first conductive material 310 has a second thickness 310a, and the first barrier/seed layer 312 has a third thickness 312a (e.g., in the z-direction). Thus, the dielectric material 308 is positioned in a first portion of the TGV, the first barrier/seed layer 312 is positioned in a second portion of the TGV, and the first conductive material 310 is positioned in a third portion of the TGV. The first thickness 308a, the second thickness 310a and the third thickness 312a of the illustrated example equate to the overall thickness 302. In some examples, the thicknesses 308a, 310a and 312a are less than the overall thickness 302.

In the illustrated example, the first barrier/seed layer 312 is positioned between the first conductive material 310 and the dielectric material 308, the dielectric material 308 is positioned between the first barrier/seed layer 312 and the first surface 106a of the glass substrate 102, and the first conductive material 310 is positioned between the first barrier/seed layer 312 and the second surface 106b of the glass substrate 102. In the illustrated example, the dielectric material 308 directly engages or couples to the first barrier/seed layer 312 and the first barrier/seed layer 312 directly engages or couples to the first conductive material 310. However, in some examples, the transverse capacitor 122 can include other intermediate layers between the first barrier/seed layer 312 and the dielectric material 308 and/or between the first barrier/seed layer 312 and the first conductive material 310.

As shown in FIG. 3, a first side 308b (e.g., a first end) of the dielectric material 308 opposite a second side 308c (e.g., a second end) is substantially flush relative to the first surface 106a of the glass substrate 102. As used herein, substantially flush means that an outer surface of the dielectric material 308 defined by the first side 308b and the first surface 106a of the glass substrate 102 are perfectly even (e.g., flat) or in the same plane (e.g., a plane in the x-y direction) or slightly offset relative to each other within a value not exceeding 2 percent (2%). Thus, a transition between the surface defined by the first side 308b of the dielectric material 308 and the first surface 106a is relatively smooth or uninterrupted. In some examples, the first side 308b of the dielectric material 308 can be offset or recessed (e.g., positioned in the TGV 304) relative to the first surface 106a of the glass substrate 102 (e.g., see FIG. 4) or can protrude externally from the TGV 304 relative to the first surface 106a of the glass substrate 102.

The dielectric material 308 can include, but is not limited to, titanium dioxide (TiO$_2$), hafnium dioxide (HfO$_2$), hafnium zirconium oxide (HZO) (e.g., HZO film), and/or any other suitable dielectric material(s) (e.g., non-conducting material(s) that stores electrical charges). The first conductive material 310 can include, but is not limited to, copper, aluminum and/or any other suitable conductive material(s).

The first barrier/seed layer 312 of the illustrated example is formed during fabrication of the transverse capacitor 122 as described in greater detail below. Specifically, the first barrier/seed layer 312 includes a conductive layer 314, a barrier layer 316, and a second conductive material 318. The barrier layer 316 facilitates bonding of the conductive layer 314 to the glass substrate 102 and/or other polymer substrates or materials. The first barrier/seed layer 312 of the illustrated example is positioned between the dielectric material 308 and the first conductive material 310. In some examples, the first barrier/seed layer 312 of the illustrated example supports the dielectric material 308. For example, the first barrier/seed layer 312 is positioned in the TGV 304 at a position (e.g., a vertical position or depth) at which the second side 308c of the dielectric material 308 is to be located in the TGV 304. In other words, the second side 308c of the dielectric material 308 directly engages the first barrier/seed layer 312.

The conductive layer 314 and a barrier layer 316 of the illustrated example each includes a side wall 320 and a base wall 322 (e.g., a bottom wall). In some examples, the side wall 320 can taper from the first surface 106a toward the base wall 322 (e.g., angled walls, 45-degree sloped walls, etc.) depending on a shape of the TGV 304 (e.g., conical, etc.). The side wall 320 and the base wall 322 of the illustrated example define a cavity 325 to receive the second conductive material 318.

To facilitate attachment between a first conductive pad 324 of the first build-up layers 104a and the dielectric material 308, the semiconductor package 100 of the illustrated example includes a second barrier/seed layer 326. The second barrier/seed layer 326 of the illustrated example includes a conductive layer 328 and a barrier layer 330. The barrier layer 330 of the second barrier/seed layer 326 of the illustrated example facilitates attachment of conductive layer 328 to the glass substrate 102, the first conductive pad 324 and/or the dielectric material 308.

Similarly, to facilitate attachment between a second conductive pad 338 of the second build-up layers 104b and the first conductive material 310, the semiconductor package 100 of the illustrated example includes a third barrier/seed layer 332. The third barrier/seed layer 332 of the illustrated example includes a conductive layer 334 and a barrier layer 336. The barrier layer 336 of the third barrier/seed layer 332 of the illustrated example facilitates attachment of conductive layer 334 to the glass substrate 102, the conductive material 310 and/or the dielectric material 308.

In the illustrated example, the conductive layers 314, 328 and 334 of the respective barrier/seed layers 312, 326, 332 can be composed of copper, aluminum, and/or any other conductive material(s). The barrier layers 316, 330, 336 of the respective barrier/seed layers 312, 326, 332 can be composed of titanium and/or any other barrier material(s). Likewise, the first conductive material 310 and the second conductive material 318 can be copper, aluminum and/or any other conductive material(s).

Figure 4:
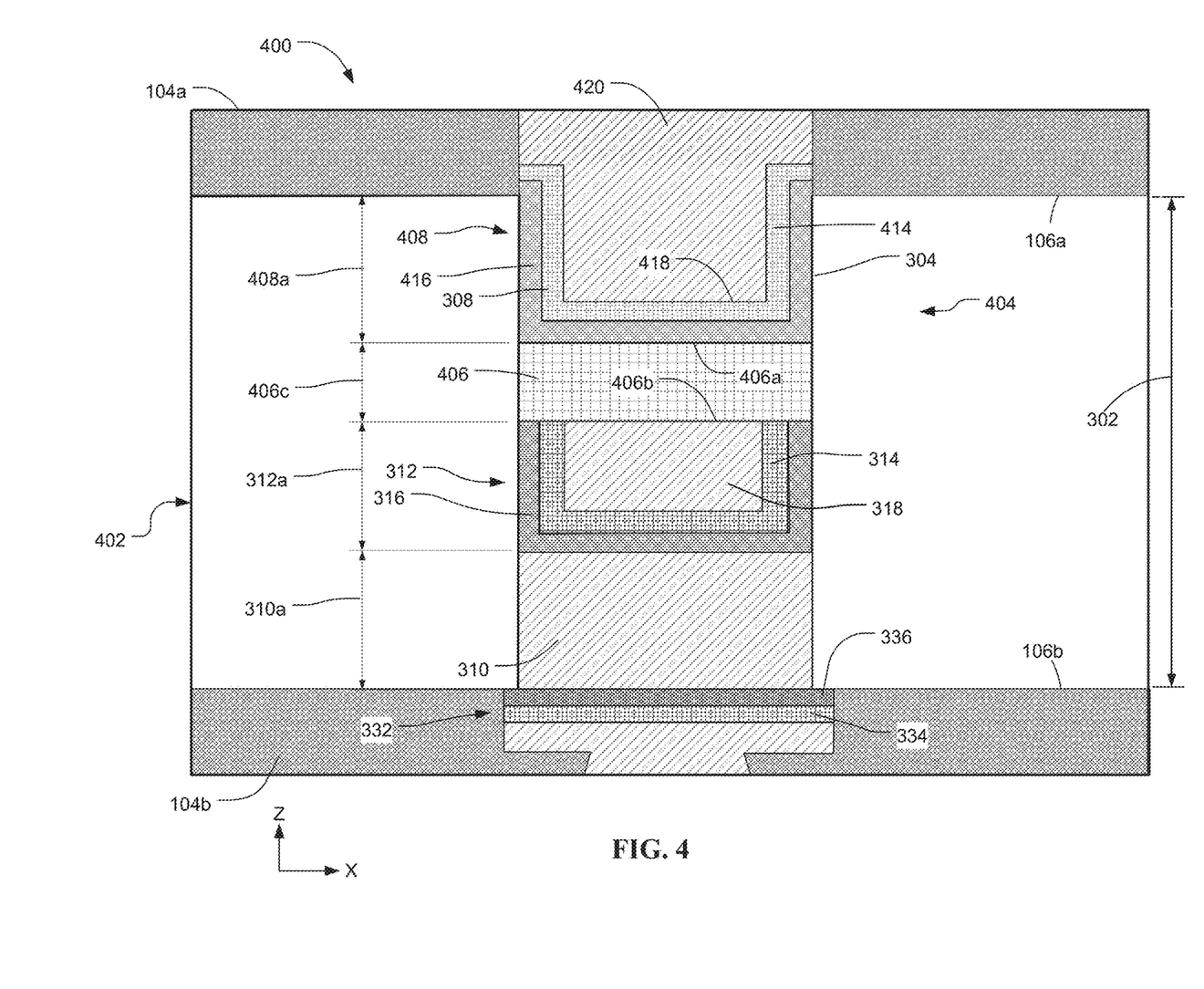
FIG. 4 is an enlarged, partial cross-sectional view of another example transverse capacitor disclosed herein.

FIG. 4 is partial, enlarged cross-sectional view of another example semiconductor package 400 including an example glass substrate 402 having another example transverse capacitor 404 disclosed herein. Many of the components of the example semiconductor package 400, the example glass substrate 402, and/or the example transverse capacitor 404 of FIG. 4 are substantially similar or identical to the components described above in connection with the semiconductor package 100, 200, the example glass substrate 102, 202, and/or the example transverse capacitor 122 of FIGS. 1-3. As such, those components will not be described in detail again below. Instead, the interested reader is referred to the above corresponding descriptions for a complete written description of the structure and operation of such components. To facilitate this process, similar or identical reference numbers will be used for like structures in FIG. 4 as used in FIGS. 1-3.

The transverse capacitor 404 of the illustrated example is formed in an TGV 304 (e.g., a TGV, a through hole) of the glass substrate 402. The transverse capacitor 404 of the illustrated example includes a dielectric material 406, a first barrier/seed layer 312 and a first conductive material 310 positioned in the TGV 304 of the glass substrate 402. The dielectric material 406 of the illustrated example is fully or completely positioned within the TGV 304 such that none of the dielectric material 406 is exposed from the first surface 106a of the glass substrate 102. In other words, the dielectric material 406 is fully enclosed within the TGV 304. For example, the dielectric material 406 of the illustrated example is offset or recessed from the first surface 106a of the glass substrate 102 (e.g., an upper or exterior surface of the glass substrate 102 in the orientation of FIG. 4). In the illustrated example, the dielectric material 406 (e.g., has a puck shape that) includes a first side 406a opposite a second side 406b, where both the first side 406a and the second side 406b are positioned in the TGV 304. For example, the first side 406a (e.g., an upper most surface) of the dielectric material 406 is oriented toward the first surface 106a and the second side 406b is oriented toward the second surface 106b. The first side 406a of the dielectric material 406 of the illustrated example is recessed or offset relative to the first surface 106a of the glass substrate 102. The second side 406b of the dielectric material 406 is in engagement (e.g., directly engaged) with the first barrier/seed layer 312. The dielectric material 406 of the illustrated example has a first thickness 406c. The first thickness 406c of the dielectric material of the illustrated example is less than a second thickness 310a of the first conductive material 310.

In the orientation of FIG. 4, the dielectric material 406 is positioned between the first barrier/seed layer 312 and a second barrier/seed layer 408. The first barrier/seed layer 312 includes a conductive layer 314 and a barrier layer 316. The first barrier/seed layer 312 is positioned between the first conductive material 310 and the dielectric material 406. The first conductive material 310 is positioned between first barrier/seed layer 312 and the third barrier/seed layer 332 (e.g., similar to FIGS. 1-3).

The second barrier/seed layer 408 of the illustrated example is positioned into and/or extends inside the TGV 304. For example, the second barrier/seed layer 408 of the illustrated example includes a conductive layer 414 and a barrier layer 416. The barrier layer 416 facilitates attachment of the conductive layer 414 to the glass substrate 102 and/or the dielectric material 406. The second barrier/seed layer 408 has a thickness 408a. Thus, in the illustrated examples, the thickness 408a of the second barrier/seed layer 408, the first thickness 406c of the dielectric material 406, the second thickness 310a of the first conductive material 310, and the third thickness 312a of the first barrier/seed layer 312 equate to the overall thickness 302 of the TGV 304 and/or the glass substrate 402 (e.g., in the z-direction). The conductive layer 414 and the barrier layer 416 of the illustrated example define a cavity or well 418. In the illustrated example, a conductive pad 420 of the build-up layer 104a is positioned or filled in the cavity 418. The second barrier/seed layer 408 facilitates attachment between the conductive pad 420 and the dielectric material 406. In some examples, a dielectric material and/or material from the first build-up layers 104a can be positioned in the cavity 418.

In the illustrated example, the conductive layer 414 of the second barrier/seed layer 408 can be composed of copper, aluminum, and/or any other conductive material(s). The barrier layer 416 of the second barrier/seed layer 408 can be composed of titanium and/or any other barrier material(s). Likewise, the conductive pad 420 can be copper, aluminum and/or any other conductive material(s). The dielectric material 308 can include, but is not limited to, titanium dioxide (TiO$_2$), hafnium dioxide (HfO$_2$), hafnium zirconium oxide (HZO) (e.g., HZO film), and/or any other suitable dielectric material(s) (e.g., non-conducting material(s) that stores electrical charges).

The semiconductor packages 100, 200 and 400, the glass substrates 102, 402, and/or the transverse capacitors 122, 404 disclosed herein can be provided using conventional manufacturing techniques. For example, some example processes that can be used include laser drilling, laser etching, polishing, photolithography, integrated circuit microfabrication techniques, wet etching, dry etching, anisotropic etching, spin coating, electroforming or electroplating, laser ablation, sputtering, chemical deposition, plasma deposition, surface modification, injection molding, hot embossing, thermoplastic fusion bonding, low temperature bonding using adhesives, stamping, machining, 3-D printing, laminating, and/or any other processes commonly used for manufacture of semiconductor devices.

Figure 5:
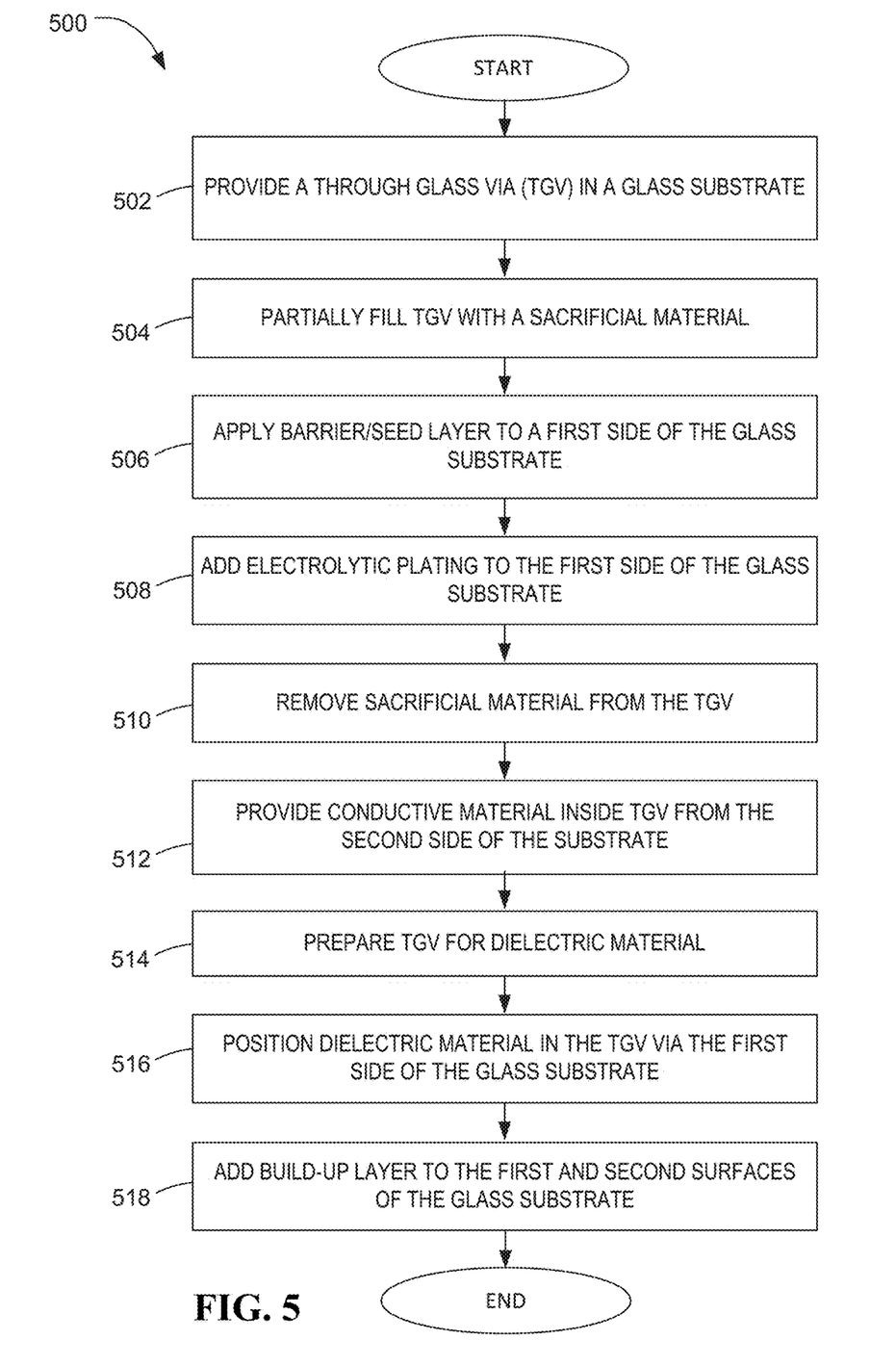
FIG. 5 is a flowchart of an example method of manufacturing an example semiconductor package disclosed herein.

FIG. 5 is a flowchart of an example method 500 of fabricating an example semiconductor package having a glass substrate and/or a transverse capacitor disclosed herein. For example, the method 500 of FIG. 5 can be used to fabricate or create the example semiconductor packages 100, 200 and 400, the glass substrates 102, 402, and/or the transverse capacitors 122, 404 disclosed herein. To facilitate discussion of the example method 500, the example method 500 will be described in connection with the example semiconductor package 100, the glass substrate 102 and the transverse capacitor 122 of FIGS. 1 and 3. For example, FIGS. 6A-6I are cross-sectional schematic illustrations of the example glass substrate 102 of FIGS. 1 and 3 at various manufacturing stages 602, 604, 606, 608, 610, 612, 614, 616, 618 corresponding to the example method 500 of FIG. 5. While an example manner of fabricating the example glass substrate has been illustrated in FIGS. 5 and 6A-6I, one of the steps and/or processes illustrated in FIGS. 5 and 6A-6I may be combined, divided, re-arranged, omitted, eliminated and/or implemented in any other way. Further still, the example methods of FIGS. 5 and 6A-6I may include processes and/or steps in addition to, or instead of, those illustrated in FIGS. 5 and 6A-6I and/or may include more than one of any or all of the illustrated processes and/or steps. Further, although the example methods are described with reference to the flowchart illustrated in FIG. 5 and the associated manufacturing stages represented in FIGS. 6A-6I, many other methods or processes of fabricating electronic packages may alternatively be used.

Referring to the example method 500 of FIG. 5, the method 500 begins by providing a TGV in the glass substrate (block 502). For example, referring to FIG. 6A, the glass substrate 102 can be composed of quartz or any other glass material(s). Formation of the TGV 304 can be achieved by any appropriate process including, but not limited to, drilling (e.g., mechanical and/or laser drilling and subsequent cleaning), etching, chemical and/or mechanical polishing, and/or any other through glass vias (TGVs) manufacturing techniques and/or any other semiconductor manufacturing process(es). The TGV 304 defines an opening including a side wall 621 extending between the first surface 106a and the second surface 106b.

After providing the opening, the TGV is partially filed with a sacrificial material (block 504). For example, referring to FIG. 6B, the TGV 304 is partially filed with a sacrificial material 620. The sacrificial material 620 of the illustrated example can be a polymer, a plug (e.g., a polymer plug), a resist material, and/or any other material that can plug and/or block passage through the TGV 304 between (e.g., from) the first surface 106a and (e.g., to) the second surface 106b. In the illustrated example, the sacrificial material 620 of the illustrated example has a first side 622 (e.g., an end) flush with the second surface 106b of the glass substrate 102 and a second side 624 (e.g., an end) opposite the first side 622 located inside the TGV 304 at a location that aligns with the first barrier/seed layer 312 of FIG. 3. In other words, the sacrificial material 620 has a thickness 620a that is substantially similar or identical (e.g., exactly or within a 10 percent tolerance) to the second thickness 310a of the first conductive material 310 of FIG. 3. The sacrificial material 620 supports fabrication of the first barrier/seed layer 312. The TGV 304 is partially filled with the sacrificial material 620 to cover a first portion 621a of the side wall 621 of the TGV 304.

Figure 6A:
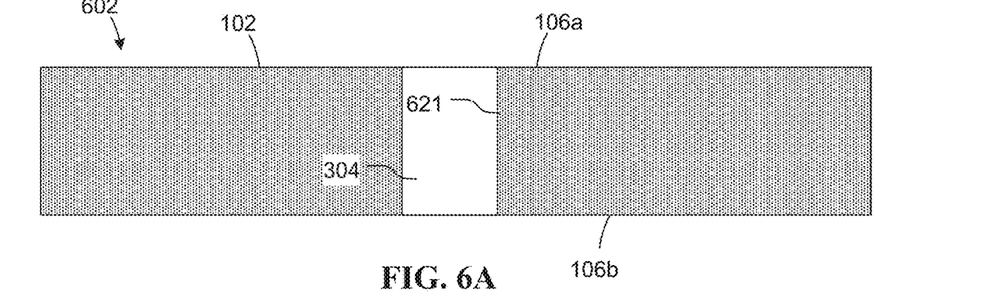
FIGS. 6A-6I depict figures showing the example glass substrate of FIGS. 1 and 3 at various manufacturing stages corresponding to the example method of FIG. 5.
Figure 6B:
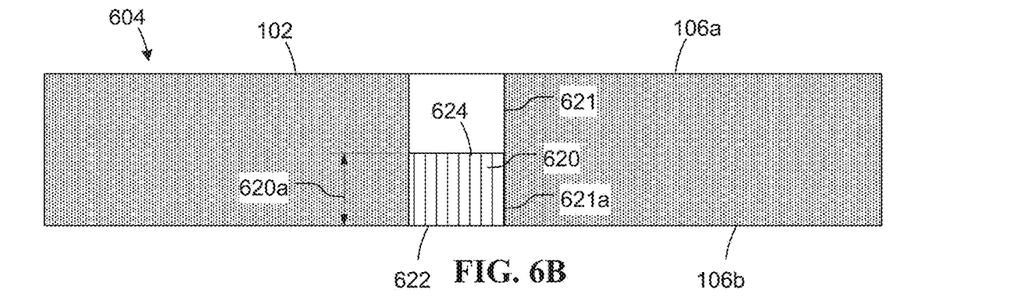
Figure 6C:
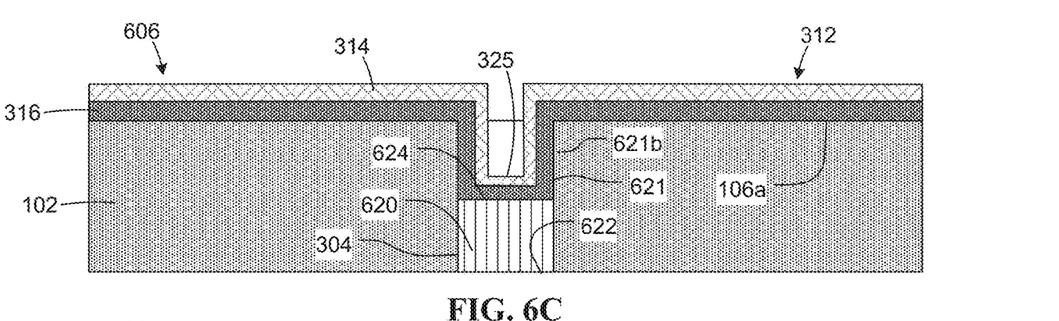
Figure 6D:
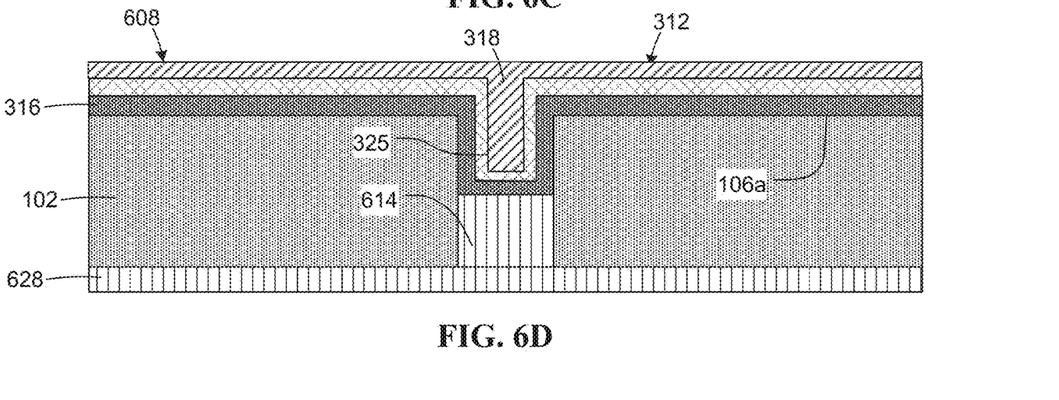
Figure 6E:
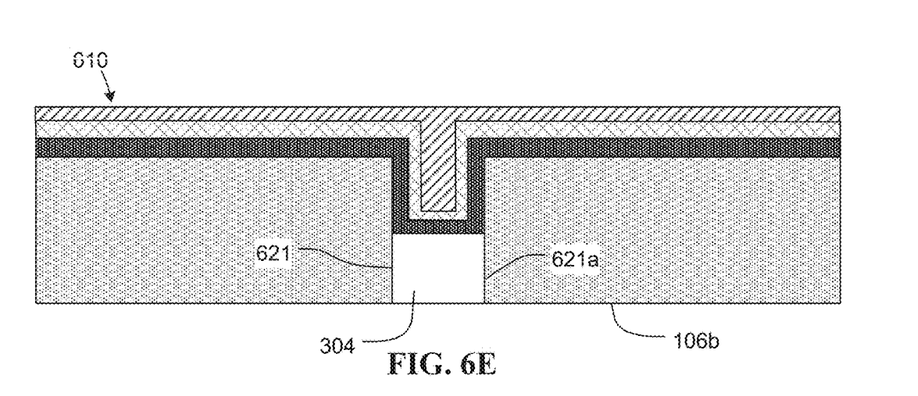
Figure 6F:
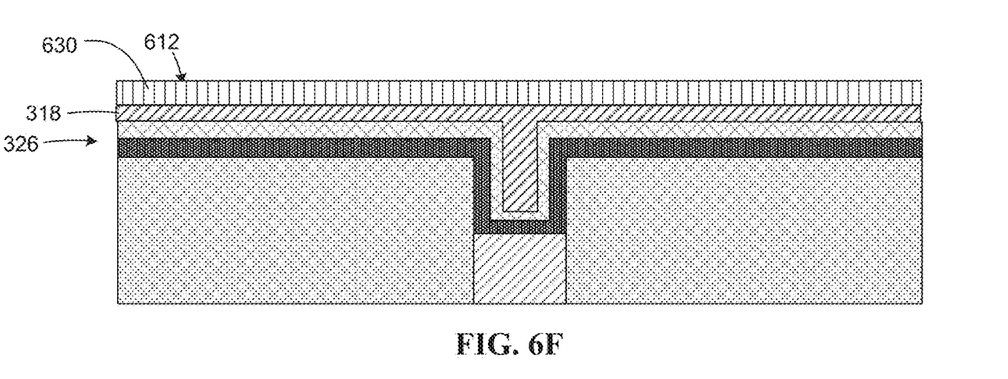

A barrier/seed layer is applied to a first side of the glass substrate (block 506). Referring to FIG. 6C, the first barrier/seed layer 312 is applied to the first surface 106a of the glass substrate 102 and a second portion 621b of the side wall 621 of the TGV 304 unprotected by the sacrificial material 620 for metallization. The first barrier/seed layer 312 of the illustrated example can be provided on the first side of the glass substrate 102 by sputter deposition and/or barrier/seed layer deposition process(es) including, but not limited to, electroless seed deposition, physical vapor deposition (PDV), chemical vapor deposition (CVD), atomic layer deposition (ALD) and/or any other suitable sputter deposition manufacturing technique(s). In the illustrated example, the first barrier/seed layer 312 is applied to the first surface 106a of the glass substrate 102 and provided in the in TGV 304 of the glass substrate 102. The sacrificial material 620 prevents the first barrier/seed layer 312 from passing through the TGV 304 to a second side and/or the second surface 106b of the glass substrate 102. For example, the sacrificial material 620 provides a plug to prevent material from flowing to the second surface 106b and provides a support for formation of the first barrier/seed layer 312 inside the TGV 304. Thus, the first barrier/seed layer 312 is applied to the first surface 106a of the glass substrate 102, the side wall 621 of the TGV 304 not covered by the sacrificial material 620, and the second side 624 of the sacrificial material 620 located inside the TGV 304 that is oriented toward the first surface 106a. The first barrier/seed layer 312 of the illustrated example is a titanium/copper (Ti/Cu) layer. In other words, the conductive layer 314 is copper and the barrier layer 316 is titanium. After formation, the first barrier/seed layer 312 defines the cavity 325.

A partial electrolytic plating is provided on the first side of the glass substrate (block 508). For example, referring to FIG. 6D, electrolytic plating can be applied to the first surface 106a (e.g., the first side) of the glass substrate 102. Specifically, the electrolytic plating is applied on the first barrier/seed layer 312. The electrolytic plating of the illustrated example provides the second conductive material 318 in the cavity 325 defined by the first barrier/seed layer 312. To prevent plating on the second surface 106b of the glass substrate 102, a protective film 628 is applied to the second surface 106b. For example, the protective film 628 can be a resist layer, resist lamination and/or any other protective film. In some examples, the protective film 628 any barrier or material(s) to restrict or prevent plating of the second surface 106b of the glass substrate 102. In some examples, the protective film 628 is not used.

Next, the sacrificial material is removed from the glass substrate (block 510). For example, referring to FIG. 6E, the sacrificial material 620 can be removed via etching (e.g., wet etching, dry etching, etc.) and/or any other manufacturing process(es). In some examples, the protective film 628 is also removed. Removal of the sacrificial material 620 exposes the first portion 621a of the side wall 621 and/or provides an access to the TGV 304 from the second surface 106b of the glass substrate 102. Thus, the TGV 304, at stage 610, is accessible from the second surface 106b of the glass substrate 102.

With the sacrificial material removed, a conductive material is provided in the TGV via the second surface of the glass substrate (block 512). For example, referring to FIG. 6F, the first conductive material 310 is provided in the TGV 304. In other words, the first conductive material 310 is provided inside the TGV 304 to fill a space (e.g., the first portion 621a) of the TGV 304 previously occupied by the sacrificial material 620. To provide the first conductive material 310 in the TGV 304, electrolytic plating is applied on the second surface 106b of the glass substrate 102. For example, a bottom up plating is performed from a second side of the glass substrate 102 to provide the first conductive material 310 in the TGV 304. To prevent electrolytic plating of the first surface 106a, a protective barrier 630 can be provided on the first barrier/seed layer 312 and/or the second conductive material 318.

Figure 6G:
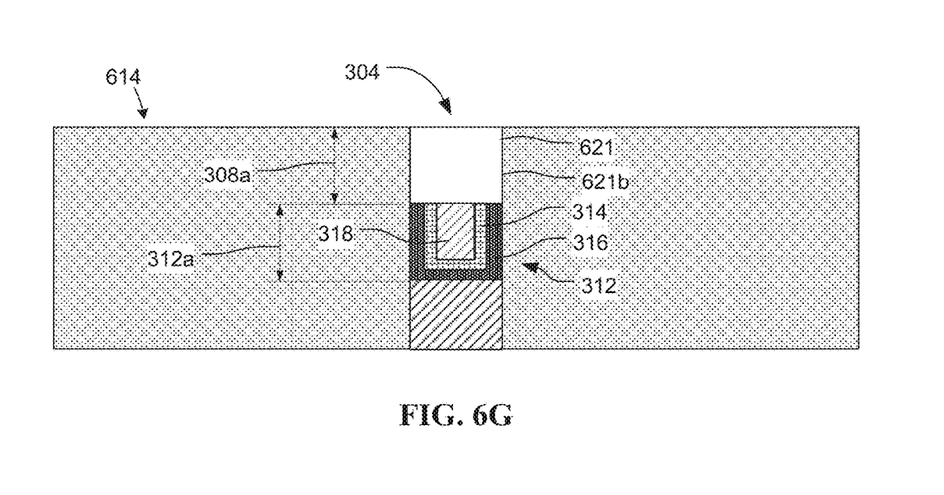

Next, the TGV is prepared for dielectric material (block 514). Referring to FIG. 6G, to prepare the TGV 304 for dielectric material, materials are removed from the first surface 106a of the glass substrate 102 and a portion of the TGV 304. For example, protective barrier 630, the second conductive material 318 and the first barrier/seed layer 312 can be removed via etching (e.g., wet etching, dry etching) and/or any other material removal manufacturing technique(s). Specifically, at least a portion of the first barrier/seed layer 312 remains in the TGV 304. Removal of the first barrier/seed layer 312 and/or other material(s) is controlled to a depth inside the TGV 304 that corresponds to a desired thickness (e.g., the first thickness 308a) of the dielectric material 308. For example, the material in (e.g., the second portion 621b) of the TGV 304 is removed (etched) from (e.g., an access oriented toward) the first side of the glass substrate 102 to a depth that corresponds to the first thickness 308a of the dielectric material 308. As a result, a portion of the first barrier/seed layer 312 is provided or remains in the TGV 304. For example, etching is controlled to achieve a desired thickness (e.g., the third thickness 312a) of the first barrier/seed layer 312 in the TGV 304. In the illustrated example, the first barrier/seed layer 312 is removed from a portion (e.g., the second portion 621b) of the side wall 621 of the TGV 304 until the first thickness 308a is achieved, resulting in the first barrier/seed layer 312 having the third thickness 312a. As a result, first barrier/seed layer 312 has the conductive layer 314, the barrier layer 316 and the second conductive material 318 located inside the TGV 304.

Figure 6H:
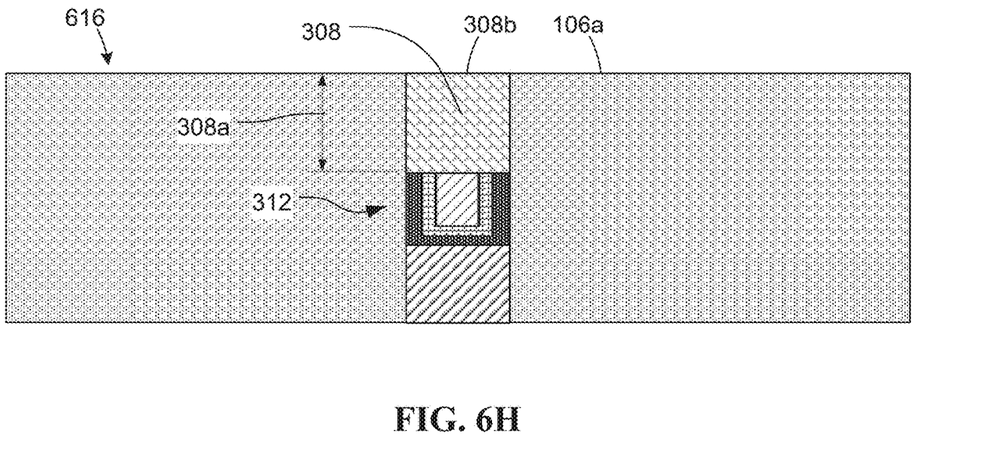
Figure 6I:
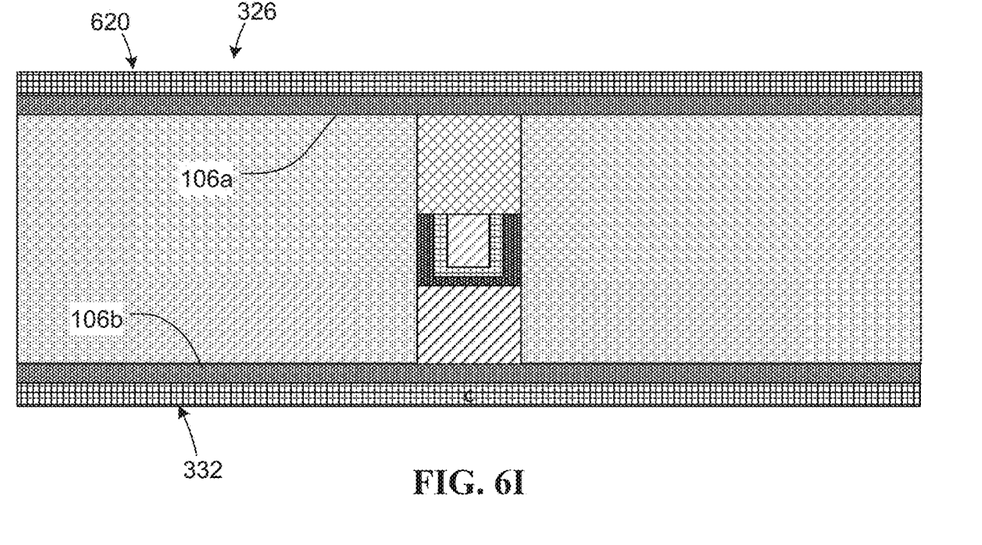

A dielectric material is positioned in the TGV 304 via the first side of the glass substrate 102 (block 516). For example, the dielectric material 308 is positioned in the TGV 304 between the first barrier/seed layer 312 and the first surface 106a of the glass substrate 102. In the illustrated example, the dielectric material 308 is positioned or filled in the TGV 304 so that the first side 308b of the dielectric material 308 is flush with the first surface 106a. In some examples, the dielectric material 308 can be mechanically polished to flush mount the first side 308b of the dielectric material 308 and the first surface 106a.

Next, build-up layers are added to the first surface and the second surface of the glass substrate (block 518). For example, referring to FIG. 6I, the second barrier/seed layer 326 is applied to the first surface 106a of the glass substrate 102 and the third barrier/seed layer 332 is applied to the second surface 106b of the glass substrate 102 to facilitate attachment of the first conductive pad 340a to the dielectric material 308 and the second conductive pad 340b to the first conductive material 310. The second barrier/seed layer 326 and the third barrier/seed layer 332 can be applied via sputter deposition, Chemical Vapor Deposition (CVD), Physical Vapor Deposition (PVD), and Atomic Layer Deposition (ALD) and/or any other deposition and/or manufacturing technique(s).

Although not shown, other build-up layers 104 can be provided on the glass substrate 102 using conventional semiconductor manufacturing techniques or processes including, but not limited to photolithography, integrated circuit microfabrication techniques, wet etching, dry etching, anisotropic etching, spin coating, electroforming or electroplating, laser ablation, sputtering, chemical deposition, plasma deposition, surface modification, injection molding, hot embossing, thermoplastic fusion bonding, low temperature bonding using adhesives, stamping, machining, 3-D printing, laminating, and/or any other processes commonly used for manufacture of semiconductor devices. For example, during further processing, portions of the second barrier/seed layer 326 and the second barrier/seed layer 332 are removed (e.g., via etching or other processes) from the respective first surface 106a and the second surface 106b of the glass substrate 102 and the build-up layers 104a, 104b are provided on the first surface 106a and the second surface 106b of the glass substrate 102 as shown, for example, in FIG. 3. In other words, the barrier/seed layers 326 and 332 are removed from the glass substrate 102 except between the conductive pads 324, 338 and the respective dielectric material 308 and the first conductive material 310.

Figure 7A:
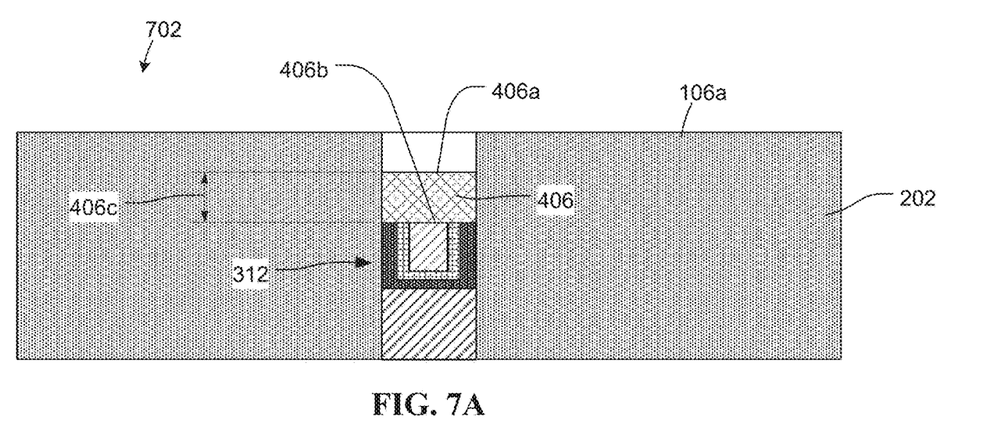
FIGS. 7A and 7B depict the example semiconductor package of FIG. 4 at various manufacturing stages corresponding to the example method of FIG. 5.
Figure 7B:
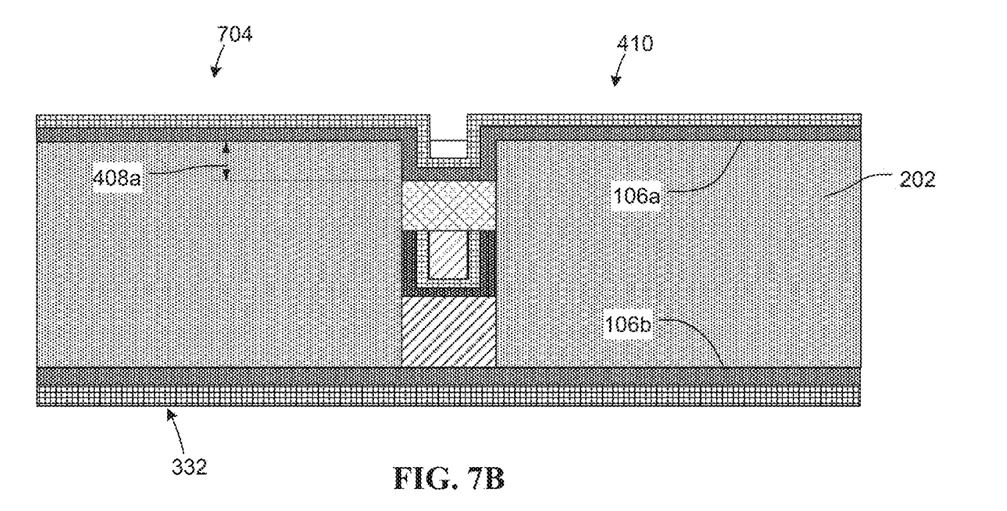

The method 500 of FIG. 5 can be employed to fabricate the example transverse capacitor 404 of FIG. 4. For example, FIGS. 7A and 7B illustrate manufacturing stages 702-704 corresponding to various stages for fabricating the transverse capacitor 404 of FIG. 4. The manufacturing process for fabricating the transverse capacitor 404 is identical to the method 500 of FIG. 5 and the example manufacturing stages 602-614 of FIGS. 6A-6G. Thus, example manufacturing stages 602-614 apply to fabrication of the glass substrate 202 of FIG. 4 to achieve the manufacturing stage 702 of FIG. 7A. In other words, FIGS. 7A and 7B replace the manufacturing stages 616 and 618 of FIGS. 6H and 6I to fabricate the transverse capacitor 404. The manufacturing stages 602-614 of FIGS. 6A-6G are not repeated here for brevity. From the manufacturing stage 614 of FIG. 6G, the manufacturing stage 702 continues fabrication of the transverse capacitor 404.

Referring to FIG. 7A, a dielectric material is positioned in the TGV from the first side of the glass substrate (block 516). For example, the dielectric material 406 is positioned in the TGV 304 between the first barrier/seed layer 312 and the first surface 106a of the glass substrate 102. In the illustrated example, the dielectric material 406 is positioned or filled in the TGV 304 so that the first side 406a of the dielectric material 308 oriented toward the first surface 106a of the glass substrate 102 is located inside the TGV 304 (e.g., the first side 406a of the dielectric material 406 is recessed relative to the first surface 106a of the glass substrate 102). In some examples, the dielectric material 406 is deposited in the TGV 304 to provide the first thickness 406c. In some examples, the dielectric material 406 is deposited in the TGV 304 and the first surface 106a of the glass substrate 102 and the dielectric material 406 is subsequently removed (e.g., etched) from the first surface 106a and the TGV 304 to a depth that corresponds to the first thickness 406c (e.g., a desired thickness) of the dielectric material 406.

Next, build-up layers are added to the first surface and the second surface of the glass substrate (block 518). For example, referring to FIG. 7B, the second barrier/seed layer 408 is applied to the first surface 106a of the glass substrate 202 and the third barrier/seed layer 332 is applied to the second surface 106b of the glass substrate 202. The second barrier/seed layer 408 and the third barrier/seed layer 332 can be applied via sputter deposition, Chemical Vapor Deposition (CVD), Physical Vapor Deposition (PVD), and Atomic Layer Deposition (ALD) and/or any other deposition and/or manufacturing technique(s). As shown in FIG. 7B, the second barrier/seed layer 408 extends inside the TGV 304 by a depth defined by the thickness 408a. Additionally, during further processing, portions of the barrier/seed layer 332 and the barrier/seed layer 408 are removed (e.g., via etching or other processes) from the respective second surface 106b and the first surface 106a of the glass substrate 402 and the build-up layers 104a, 104b are provided on the first surface 106a and the second surface 106b of the glass substrate 402 as shown, for example, in FIG. 4.

Although not shown, other build-up layers 104 can be provided on the glass substrate 202 using conventional semiconductor manufacturing techniques or processes including, but not limited to photolithography, integrated circuit microfabrication techniques, wet etching, dry etching, anisotropic etching, spin coating, electroforming or electroplating, laser ablation, sputtering, chemical deposition, plasma deposition, surface modification, injection molding, hot embossing, thermoplastic fusion bonding, low temperature bonding using adhesives, stamping, machining, 3-D printing, laminating, and/or any other processes commonly used for manufacture of semiconductor devices.

The foregoing examples of the semiconductor packages 100, 200 and 400, the glass substrates 102, 402, and/or the transverse capacitors 122, 404 teach or suggest different features. Although each example the semiconductor packages 100, 200 and 400, the glass substrates 102, 402, and/or the transverse capacitors 122, 404 disclosed above has certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

Example methods, apparatus, systems, and articles of manufacture to implement glass substrates for semiconductor packages are disclosed herein. Further examples and combinations thereof include the following:

Example 1 includes a semiconductor package including a glass substrate having a through glass via between a first surface and a second surface opposite the first surface. A transverse capacitor is located in the through glass via. The transverse capacitor includes a dielectric material positioned in a first portion of the through glass via, a first barrier/seed layer positioned in a second portion of the through glass via, and a first conductive material positioned in a third portion of the through glass via.

Example 2 includes the semiconductor package of example 1, where the first barrier/seed layer is positioned between the dielectric material and the first conductive material.

Example 3 includes the semiconductor package of examples 1 or 2, where first conductive material is positioned between the second surface of the glass substrate and the first barrier/seed layer.

Example 4 includes the semiconductor package of any one of examples 1-3, where the dielectric material is positioned between the first surface of the glass substrate and the first barrier/seed layer.

Example 5 includes the semiconductor package of any one of examples 1-4, where the dielectric material includes a first side and a second side opposite the first side, wherein the first side is flush relative to the first surface of the glass substrate and the second side is oriented toward the first barrier/seed layer.

Example 6 includes the semiconductor package of any one of examples 1-5, where the second side of the dielectric material directly engages the first barrier/seed layer.

Example 7 includes the semiconductor package of any one of examples 1-6, where the dielectric material includes a first side and a second side opposite the first side, wherein the first side and the second side are located inside the through glass via.

Example 8 includes the semiconductor package of any one of examples 1-7, further including a second barrier/seed layer positioned in the through glass via such that the dielectric material is positioned between the first barrier/seed layer and the second barrier/seed layer.

Example 9 includes the semiconductor package of any one of examples 1-8, where the first side of the dielectric material directly engages the first barrier/seed layer and the second side of the dielectric material directly engages the second barrier/seed layer.

Example 10 includes a semiconductor package including a glass substrate having a through glass via. A structure is provided in the through glass via. The structure includes: a first conductive material; a first layer including a conductive material; a second layer including titanium; a second conductive material positioned in a cavity defined by the first layer and the second layer; and a dielectric material positioned directly on at least one of the first layer, the second layer or the second conductive material.

Example 11 includes the semiconductor package of example 10, where dielectric material has a first end directly engaged with at least one of the first layer or the second layer and a second end flush with the first surface of the glass substrate.

Example 12 includes the semiconductor package of examples 10 or 11, where dielectric material has a first end directly engaged with at least one of the first layer or the second layer and a second end recessed from the first surface 106a and positioned inside the through glass via.

Example 13 includes the semiconductor package of any one of examples 13-15, further including a third layer including a conductive material and a fourth layer including titanium located inside the through glass via and positioned directly on the second end of the dielectric material.

Example 14 is an example method including: providing a through glass via (TGV) in a glass substrate; partially filling the TGV with a sacrificial material to cover a first portion of a side wall of the TGV; applying a barrier/seed layer to a first side of the glass substrate and a second portion of the TGV unprotected from the sacrificial material; adding electrolytic plating to the first side of the glass substrate; removing the sacrificial material from the TGV to expose the first portion of the side wall of the TGV; providing a first conductive material inside the TGV from a second side of the glass substrate to fill the TGV along the first portion of the side wall with the first conductive material; removing a portion of the first barrier/seed layer from the TGV from the first side of the glass substrate such that a portion of the first barrier/seed layer remains in the TGV; and adding dielectric material in the TGV between the remaining portion of the first barrier/seed layer and the first surface of the glass substrate.

Example 15 includes the method of example 14, where further including flush mounting the dielectric material with the first surface of the glass substrate.

Example 16 includes the method of example 15, where the removing the portion of the first barrier/seed layer from the TGV includes removing the first barrier/seed layer from the TGV to a depth that corresponds to a desired thickness of the dielectric material.

Example 17 includes the method of examples 14 or 15, where the adding the dielectric material includes adding the dielectric material in the TGV such that a first side of the dielectric material oriented toward the first surface of the glass substrate is recessed relative to the first surface of the glass substrate.

Example 18 includes the semiconductor package of any one of examples 14-17, further including adding a second barrier/seed layer inside the TGV Example 19 includes the semiconductor package of any one of examples 14-17, further including further including removing the sacrificial material from the TGV after applying the first barrier/seed layer and prior to adding the first conductive material.

Example 20 includes the semiconductor package of any one of examples 14-17, where adding electrolytic plating to the first side of the glass substrate includes adding a second conductive material to the first barrier/seed layer Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. A semiconductor package comprising:
   a glass substrate having a through glass via, the through glass via having a length extending between a first surface of the glass substrate and a second surface of the glass substrate opposite the first surface; and a transverse capacitor located in the through glass via, the transverse capacitor including:
- a dielectric material in a first portion of the length of the through glass via, the dielectric material absent from second and third portions of the length of the through glass via, the second portion distinct from the first portion, the third portion distinct from the first portion and distinct from the second portion;
- a first barrier layer in the second portion of the length of the through glass via, the first barrier layer absent from the first and third portions; and
- a first conductive material in a third portion of the length of the through glass via, the first conductive material absent from the first and second portions.

2. The semiconductor package of claim 1, wherein the first barrier layer is between the dielectric material and the first conductive material.

3. The semiconductor package of claim 2, wherein the first conductive material is between the second surface of the glass substrate and the first barrier layer.

4. The semiconductor package of claim 3, wherein the dielectric material is between the first surface of the glass substrate and the first barrier layer.

5. The semiconductor package of claim 4, wherein the dielectric material includes a first side and a second side opposite the first side, wherein the first side is flush relative to the first surface of the glass substrate and the second side is oriented toward the first barrier layer.

6. The semiconductor package of claim 5, wherein the second side of the dielectric material directly engages the first barrier layer.

7. The semiconductor package of claim 4, wherein the dielectric material includes a first side and a second side opposite the first side, and the first side and the second side are located inside the through glass via.

8. The semiconductor package of claim 7, further including a second barrier layer in a fourth portion of the length of the through glass via such that the dielectric material is between the first barrier layer and the second barrier layer.

9. The semiconductor package of claim 8, wherein the first side of the dielectric material directly engages the first barrier layer and the second side of the dielectric material directly engages the second barrier layer.

10. The semiconductor package of claim 1, wherein the dielectric material spans a diameter of the through glass via.

11. The semiconductor package of claim 1, wherein the dielectric material is in contact with a side wall of the through glass via, the first barrier layer is in contact with the side wall of the through glass via, and the first conductive material is in contact with the side wall of the through glass via.

12. A semiconductor package comprising:
- a glass substrate having a first surface, a second surface, and a through glass via extending between the first and second surfaces;
- a structure provided in the through glass via, the structure including:
  - a first conductive material;
  - a first layer different from the first conductive material, the first conductive material closer to a first end of the through glass via than the first layer is to the first end of the through glass via;
  - a second conductive material different from the first layer, the second conductive material in a cavity defined by the first layer, the first layer closer to the first end of the through glass via than the second conductive material is to the first end of the through glass via; and
  - a dielectric material directly on at least one of the first layer or the second conductive material, both the first layer and the second conductive material closer to the first end of the through glass via than the dielectric material is to the first end of the through glass via.

13. The semiconductor package of claim 12, wherein the dielectric material has a first end directly engaged with the first layer and a second end flush with the first surface of the glass substrate.

14. The semiconductor package of claim 12, wherein the dielectric material has a first end directly engaged with the first layer and a second end recessed from the first surface and positioned inside the through glass via.

15. The semiconductor package of claim 14, further including a third layer including a conductive material and a fourth layer including titanium located inside the through glass via and directly on the second end of the dielectric material.

16. The semiconductor package of claim 12, including a second layer adjacent the first layer, the second layer including titanium.

17. The semiconductor package of claim 12, wherein the dielectric material is closer to a second end of the through glass via than the first layer is to the second end of the through glass via and the dielectric material is closer to the second end of the through glass via than the second conductive material is to the second end of the through glass via.

* * * * *